(12) United States Patent
El Markhi et al.

(10) Patent No.: US 11,196,281 B2
(45) Date of Patent: Dec. 7, 2021

(54) CHARGING CURRENT LIMIT CIRCUIT

(71) Applicant: TEXAS INSTRUMENTS INCORPORATED, Dallas, TX (US)

(72) Inventors: Mustapha El Markhi, Richardson, TX (US); Rohit Bhan, Plano, TX (US); Thomas Vermeer, Plano, TX (US); Daniel Mavencamp, Rockwall, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 455 days.

(21) Appl. No.: 16/370,151

(22) Filed: Mar. 29, 2019

(65) Prior Publication Data
US 2020/0313444 A1 Oct. 1, 2020

(51) Int. Cl.
*H02J 7/00* (2006.01)
*G01R 19/165* (2006.01)
*H03M 1/00* (2006.01)

(52) U.S. Cl.
CPC ........ *H02J 7/008* (2013.01); *G01R 19/16542* (2013.01); *H03M 1/001* (2013.01)

(58) Field of Classification Search
CPC .... H02J 7/008; G01R 19/16542; H03M 1/001
USPC ....................................................... 320/162
See application file for complete search history.

(56) References Cited

U.S. PATENT DOCUMENTS

| 7,436,152 B1* | 10/2008 | Potanin ................ H02J 7/0071 320/162 |
| 9,935,643 B1* | 4/2018 | Chang ................. H03M 1/0863 |
| 2008/0238361 A1* | 10/2008 | Pinnell ...................... H02J 7/04 320/107 |
| 2016/0064979 A1* | 3/2016 | Huang ................. H02J 7/0029 320/114 |

FOREIGN PATENT DOCUMENTS

| EP | 0682824 B1 * | 7/1998 | ............ H02J 7/0013 |
| WO | WO-9517022 A1 * | 6/1995 | .......... H01M 10/443 |

OTHER PUBLICATIONS

Linear Technology, "Dual-Input Power Manager / 3.5A Li-Ion Battery Charger with I2C Control and USB OTG," LTC4155, Copyright Linear Technology Corporation 2011, 52 p.

* cited by examiner

*Primary Examiner* — Suresh Memula
(74) *Attorney, Agent, or Firm* — Michelle F. Murray; Charles A. Brill; Frank D. Cimino

(57) ABSTRACT

Aspects of the present disclosure provide for circuit. In at least some examples, the circuit includes a controller, a current source, a switch, and a digital-to-analog converter (DAC). The controller includes an analog-to-digital converter (ADC) having an input and an output, a first register, and a second register coupled to the output of the ADC. The switch is coupled between an output of the current source and a first node and has a control terminal coupled to the controller. The first node is coupled to the input of the ADC and is configured to couple to a resistor. The DAC has an input coupled to the controller and an output configured to couple to a battery.

20 Claims, 5 Drawing Sheets

CHARGING CURRENT LIMIT CIRCUIT

SUMMARY

Aspects of the present disclosure provide for circuit. In at least some examples, the circuit includes a controller, a current source, a switch, and a digital-to-analog converter (DAC). The controller includes an analog-to-digital converter (ADC) having an input and an output, a first register, and a second register coupled to the output of the ADC. The switch is coupled between an output of the current source and a first node and has a control terminal coupled to the controller. The first node is coupled to the input of the ADC and is configured to couple to a resistor. The DAC has an input coupled to the controller and an output configured to couple to a battery.

Other aspects of the present disclosure provide for a circuit. In at least some examples, the circuit includes a controller configured to control charging of a battery, a current source configured to source a constant current, a switch, and a DAC. The controller includes an ADC having an input and an output, a first register configured to receive a programmed charging current value, and a second register coupled to the output of the ADC. The switch is controlled by the controller and is coupled between the current source and a first node coupled to the ADC. The switch is configured to couple to a resistor to determine a maximum charging current for the battery. The DAC is coupled to the controller and the battery and configured to provide a charging current to the battery based on control exerted on the DAC by the controller.

Other aspects of the present disclosure provide for a system. In at least some examples, the system includes a battery and a battery charging circuit coupled to the battery. In at least some examples, the battery charging circuit includes a controller, a current source, a switch, a resistor, and a DAC. The controller includes an ADC having an input and an output, a first register configured to receive a programmed charging current for charging the battery via a DAC, and a second register coupled to the output of the ADC. The switch is coupled between an output of the current source and a first node and has a control terminal coupled to the controller. The first node is coupled to the input of the ADC to enable the ADC to determine a maximum charging current for charging the battery. The resistor is coupled to the first node. The DAC has an input coupled to the controller and an output coupled to the battery.

BRIEF DESCRIPTION OF THE DRAWINGS

For a detailed description of various examples, reference will now be made to the accompanying drawings in which.

DETAILED DESCRIPTION

Figure 1:
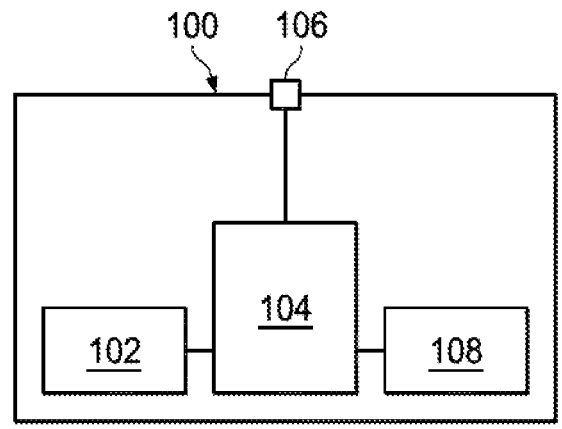
FIG. 1 shows a block diagram of an illustrative system in accordance with various examples.

Rechargeable batteries, and particularly batteries of certain chemical technologies such as lithium-ion batteries, can become volatile under certain conditions. Nevertheless, the desirability of using rechargeable batteries oftentimes outweighs the risks associated with volatility of the rechargeable batteries. The volatility of these rechargeable batteries can in turn cause damage to one or more devices coupled to, or powered by, the rechargeable battery, degrading user satisfaction with the devices. The volatility can further create a risk of injury for a user, for example, if the rechargeable battery were to overheat, catch on fire, explode, etc. One potential cause of this volatility can be charging the rechargeable batteries with too great a charge current. This can be cause, in some examples, by user mistake, manufacturing error, or by actions taken by malicious third-party actors. For example, a manufacturer may program an incorrect charge current, may select an incorrect part, or a third-party may access an electronic system and make an unauthorized modification to a programmed charge current, all of which may cause damage or destruction to the device implementing the rechargeable battery and/or injury to a user of the device implementing the rechargeable battery. Because of the desire for using rechargeable batteries, in at least some device implementations it may be desirable to mitigate the chances of a rechargeable battery being recharged with a current of a great enough value that volatility of the rechargeable battery becomes a risk.

At least some aspects of the present disclosure provide for a charge current limiting circuit. The charge current limiting circuit, in some examples, is configured to charge a rechargeable battery at a programmable rate (e.g., using a programmed and controllable charge current) while also implementing a hardware-based limit to the charge current. In at least some examples the charge current limiting circuit receives a digital signal representing a programmed charging current (e.g., such as from a register or other storage component of a device coupled to the charge current limiting circuit). Based on the received digital signal, the charge current limiting circuit controls one or more transistors to conduct or not conduct current between respective source and drain terminals of the transistors, providing current to a rechargeable battery to charge the rechargeable battery. The charge current limiting circuit is further configured to couple to a current-limiting resistor ($R_{max}$) that is configured to limit the current provided to the rechargeable battery, regardless of the programmed charging current indicated by the digital signal. For example, if $R_{max}$ has a resistance value such that the charge current limiting circuit is limited to a maximum charge current of $I_{max}$, and the digital signal indicates a programmed charging current of $I_{max}+X$, where X is any positive, non-zero number, the rechargeable battery is recharged with a charging current of $I_{max}$ as limited by the current-limiting resistor. If the digital signal indicates a programmed charging current of $I_{max}X$, the rechargeable battery is recharged with a charging current of $I_{max}-X$, where X is again any positive, non-zero number. In at least some examples, $I_{max}$ is determined according to $2*R_{max}*80*10^{-6}/1.2*2B$. For a given $I_{max}$, $R_{max}$ may then be determined.

Turning now to FIG. 1, a block diagram of an illustrative system 100 is shown. In at least some examples, the system 100 is representative of a consumer or other electronic device, such as a wearable device (e.g., a headset, earbuds, hearing aids, smart watches, fitness accessories, patient monitors, etc.), a smartphone, a laptop computer, a notebook or netbook computer, a tablet device, a power tool, or any other device that is at least partially powered by a rechargeable battery. In at least some examples, the rechargeable battery is configured to be recharged within the system 100. In various examples, the system 100 includes a battery 102, a battery charging circuit 104, a charging port 106, and a load 108. The battery 102 is any suitable type of battery that is capable of providing power to components of the system 100, such as at least the load 108, and in some circumstances, the battery charging circuit 104 and/or the battery charging port 106 (e.g., such as in a circumstance in which power is provided from the battery 102 to a device (not shown) coupled to the battery charging port 106 to charge and/or power the device coupled to the battery charging port 106). In at least one example, the battery charging circuit 104 is a controller that controls all, or substantially all, aspects of charging of the battery 102. In other examples, the battery charging circuit 104 is a charge current limiting circuit, configured to control and/or limit a charging current provided to the battery 102, as discussed herein. In yet other examples, the battery charging circuit 104 comprises the charge current limiting circuit in addition to other components related to charging of the battery 102. In an example, the battery charging circuit 104 is a single chip housed inside a package. In another example, the battery charging circuit 104 includes circuitry distributed across multiple chips, with all such chips housed inside a single package. In yet other examples, various packages housing chips are coupled together to create the functionality of the battery charging circuit 104.

The battery charging circuit 104 is coupled to the battery charging port 106, to which a power supply (not shown) couples to provide power (e.g., mains power) to the system 100. For example, the battery charging port 106 is suitable for connection by a user to mains power via an adapter (not shown) or to a device for powering the device, as discussed above. The system 100 is merely an example system in which the battery charging circuit 104 can be implemented. Other systems or devices that use rechargeable batteries will also find benefit with the battery charging circuit 104.

In at least one example of operation, the battery charging circuit 104 receives power via the battery charging port 106 and uses the power to charge the battery 102. Specifically, the battery charging circuit 104 implements the techniques alluded to above and described in greater detail below to maintain a safe charging current for the battery 102 by implementing a customizable hardware-based limit to the charging current while maintaining an ability to program the charging current to enable the battery charging circuit 104 to support multiple charging profiles, providing charging and charge current protection across a wide spectrum of charging currents and charge capacities of the battery 102. As explained, these techniques are especially helpful in preventing potentially volatile conditions of the battery 102 caused by providing the battery 102 with a charge current that exceeds safe limits (e.g., such as Imax) of the battery 102, at least partially mitigating risk of damage to the system 100 and/or injury to a user of the system 100.

Figure 2:
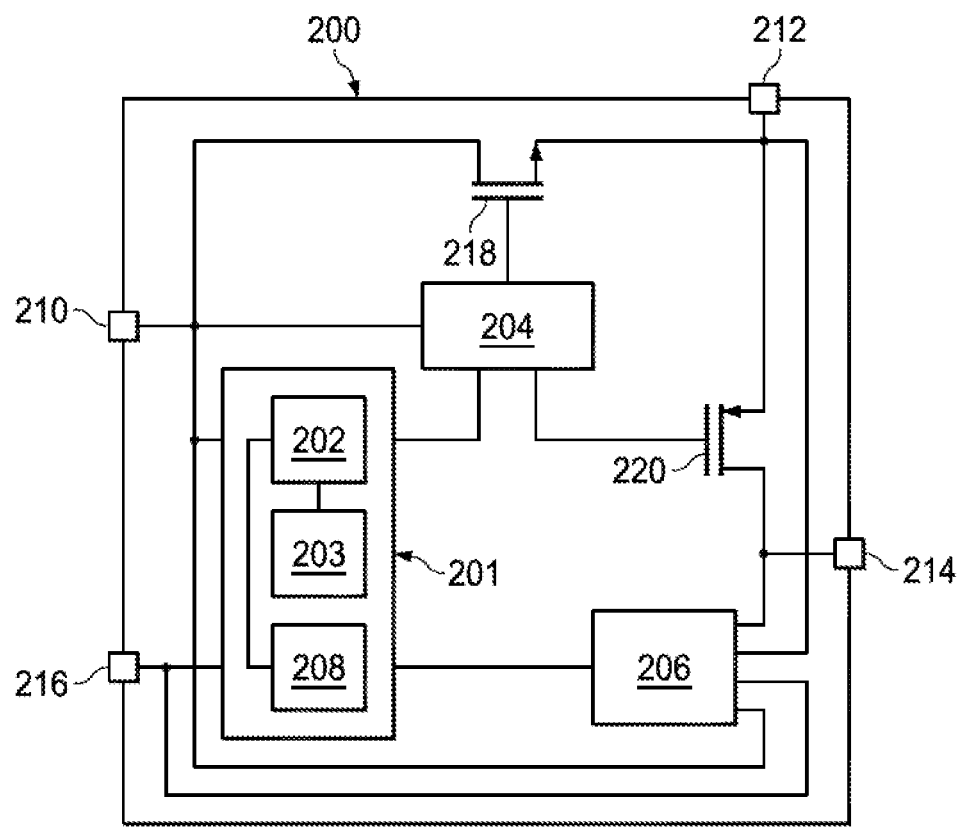
FIG. 2 shows a block diagram of an illustrative circuit in accordance with various examples.

Turning now to FIG. 2, a block diagram of an illustrative circuit 200 is shown. In at least some examples, the circuit 200 is suitable for implementation as the battery charging circuit 104 of the system 100 of FIG. 1. For example, the circuit 200 may be an integrated battery charge management circuit that integrates a plurality of charge management and/or control circuits into a single chip and/or package. In at least one example, the circuit 200 includes a control circuit 201, a field-effect transistor (FET) control circuit 204, and an analog-to-digital converter (ADC) 206. The control circuit 201, in addition to including other components and/or circuits not shown, includes at least a charge current limiting circuit 208. The circuit 200 further includes a plurality of external pins (e.g., pins that will be exposed via leads, pads, or other electrically conductive structures, to an outside world outside of a package that houses the circuit 200) including at least a voltage input (Vin) pin 210, a power middle (PMID) pin 212, a battery pin 214, and an $I_{max}$ pin 216. In at least one example, the $I_{max}$ pin 216 is further coupled to and/or considered an element of, the charge current limiting circuit 208. In various examples, the circuit 200 further includes transistor 218 and transistor 220 (e.g., such as FETs) configured to function as switches to control the flow of current through at least a portion of the circuit 200. In at least some examples, while the transistor 218 and the transistor 220 are each illustrated as single transistors, in implementation one or both of the transistor 218 and the transistor 220 may instead be implemented as a plurality of transistors in parallel (e.g., such that an amount of current passing from a net at which the drain terminals of the parallel combination of transistors are coupled to a net at which the source terminals of the parallel combination of transistors are coupled increases with the number of parallel transistors turned on or operating in a conductive state and decreases with the number of parallel transistors turned off or operating in a non-conductive state. For example, in at least some implementations the transistor 218 is representative of a back-to-back n-type metal oxide semiconductor FET (MOSFET) (NMOS) pair. While some illustrative components and/or pins of the circuit 200 are illustrated and discussed herein, in various implementations the circuit 200 can include additional components and/or pins that are not shown, and the components discussed herein may provide additional functionality not discussed herein. For example, in at least some architectures the control circuit 201 further includes digital logic and/or other decision making or processing circuitry 202 (e.g., such as at least including a digital-to-analog converter (DAC)) and at least one register or other data storage circuitry 203, each as is discussed in greater detail below herein.

In at least one example, the control circuit 201 is coupled to the FET control circuit 204, the ADC 206, the Vin pin 210, and the $I_{max}$ pin 216. The FET control circuit 204 is coupled to the Vin pin 210, the battery pin 214, the transistor 218, and the transistor 220. The ADC 206 is coupled to the Vin pin 210, the PMID pin 212, the battery pin 214, and the $I_{max}$ pin 216. The transistor 218 has a gate terminal coupled to the FET control circuit 204, a drain terminal coupled to the Vin pin 210, and a source terminal coupled to the PMID pin 212. The transistor 220 has a gate terminal coupled to the FET control circuit 204, a source terminal coupled to the PMID pin 212, and a drain terminal coupled to the battery pin 214.

In an example of operation, the circuit 200 is configured to receive an input voltage and control charging of a battery (e.g., as would be coupled to the circuit 200 at the battery pin 214). In at least some examples, the circuit 200 further controls providing of power from the battery pin 214 to the PMID pin 212, from the battery pin 214 to the Vin pin 210, and/or providing of power from the Vin pin 210 to the PMID pin 212. In at least some examples, more than one coupling occurs at a time, for example, such that the Vin pin 210 is coupled to the PMID pin 212 while power is also provided to the battery pin 214 (e.g., based at least partially on a signal received at the Vin pin 210) for charging a battery coupled to the battery pin 214. The control circuit 201, in some examples, is configured to monitor one or more conditions related to charging of a battery coupled to the battery pin 214 and control the charging of the battery coupled to the battery pin 214. For example, the control circuit 201 controls a maximum charge current provided to the battery pin 214 (e.g., such as via the charge current limiting circuit 208), receives measurements from the ADC 206, receives one or more control signals and/or values for use in charging a battery coupled to the battery pin 214, and/or controls the FET control circuit 204 to provide power to the battery pin 214 for charging a battery coupled to the battery pin 214. The FET control circuit 204, in at least some examples, controls the transistor 218 for providing power from the Vin pin 210 to the PMID pin 212 and controls the transistor 220 to provide power to the battery pin 214 for charging a battery coupled to the battery pin 214. The ADC 206 receives one or more signals in an analog format and converts the signals to a digital format before providing the signals to the control circuit 201, for example, for use by the control circuit 201 in controlling charging of the battery coupled to the battery charging pin 214.

In at least some examples, the circuit 200 is configured to couple to $R_{max}$ at the $I_{max}$ pin 216. A resistance value of Rmax, in at least some examples, at least partially determines a maximum charging current allowable for a signal provided to the battery pin 214. Rmax, in at least some examples, is coupled by a user to the circuit 200 at the $I_{max}$ pin 216 such that the user determines $I_{max}$ (e.g., based on specifications, limits, or characteristics of a battery that the user coupled to the battery pin 214). In at least one example, a larger resistance value of $R_{max}$ corresponds to a larger $I_{max}$ and a smaller resistance value of $R_{max}$ corresponds to a smaller $I_{max}$. Based on $R_{max}$, the charge current limiting circuit 208 limits (e.g., clamps) the amount of current provided to the battery pin 214 to $I_{max}$. In at least some examples, the ADC 206 converts a signal present at the $I_{max}$ pin 216 from an analog value to a digital value and provides the digital value to the control circuit 201 for storage (e.g., in a register) as $I_{max}$ to enable subsequent comparison by the control circuit 201 of $I_{max}$ to a programmed charge current.

The circuit 200 is further configured to receive and store a digital signal that indicates the programmed charge current for the circuit 200 to charge a battery coupled to the battery pin 214. Based on the received digital signal, the circuit 200 controls an amount of current via the charge current limiting circuit 208, subject to $R_{max}$, as discussed above, provided to the battery pin 214 to charge a battery coupled to the battery pin 214. In at least some examples, a plurality of digital signals are received, such that a first amount of current is provided to the battery pin 214 at a first time and a second amount of current is provided to the battery pin 214 at a second time, each subject to $R_{max}$, as discussed above. In this way, the charge current limiting circuit 208 controls a charge current provided to the battery pin 214, subject to $R_{max}$, while permitting the charge current to vary based on the received digital signal and programmed charge current (e.g., supporting multiple charging profiles for a battery coupled to the battery pin 214).

Figure 3:
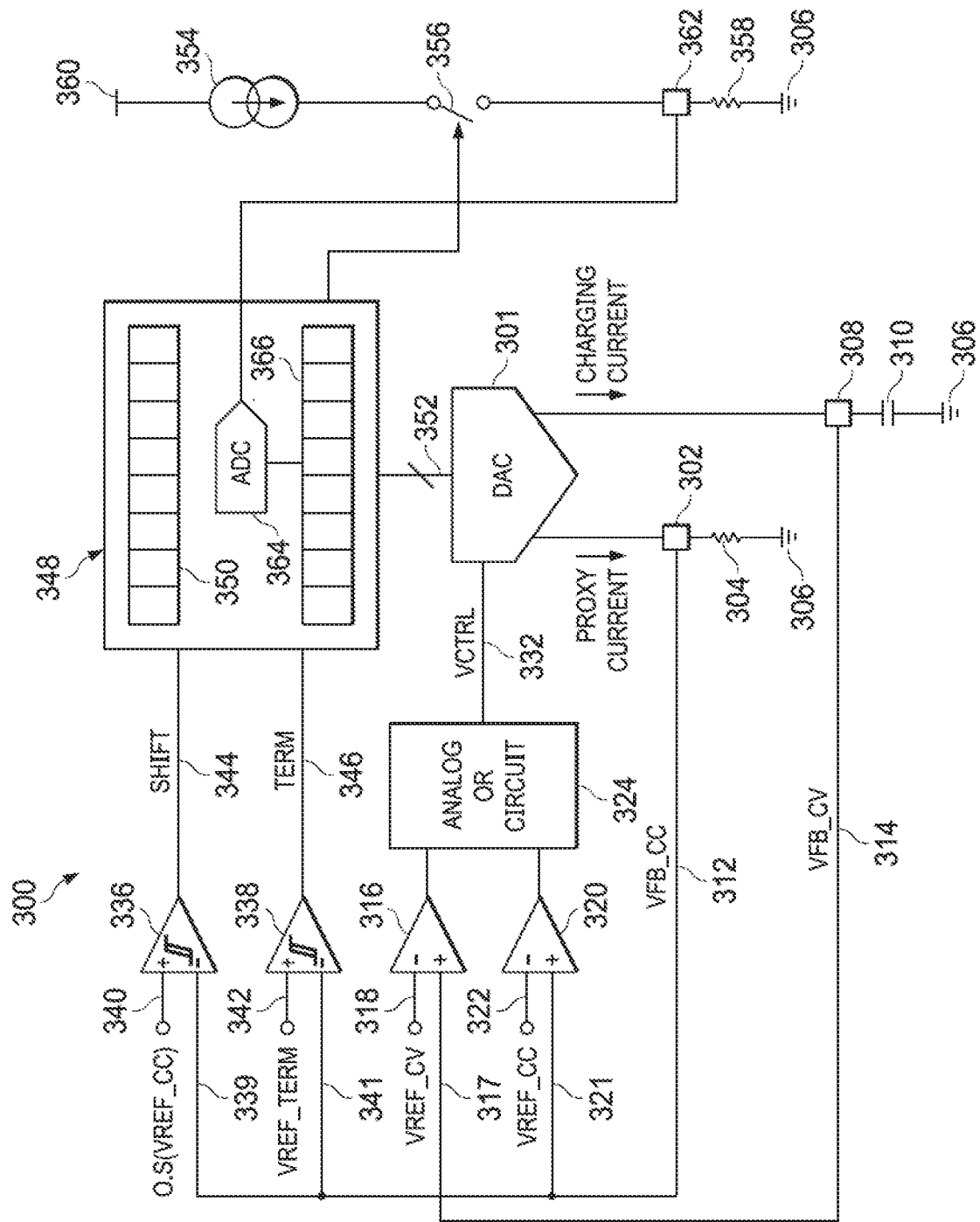
FIG. 3 shows a schematic diagram of an illustrative circuit in accordance with various examples.

Turning now to FIG. 3, a schematic diagram of an illustrative circuit 300 is shown. In various examples, the circuit 300 is suitable for implementation as the battery charging circuit 104 of the system 100 of FIG. 1 and/or the charge current limiting circuit 208 of the circuit 200 of FIG. 2. The circuit 300 includes a digital-to-analog converter (DAC) 301. The DAC 301 has a first output that couples to a node 302 and a second output that couples to a node 308 (which, in some examples, is referred to as a battery pin). The node 302 couples to a resistor 304 which, in turn, couples to a ground terminal 306. The resistance of the resistor 304 can be selected as desired to realize the functions described herein. The node 308 couples to a battery 310, represented in FIG. 3 as a capacitor. The battery 310, in turn, couples to ground terminal 306. The node 302 also couples to an amplifier 320 (e.g., a differential amplifier), a comparator 336, and a comparator 338. The node 308 couples to an amplifier 316 (e.g., a differential amplifier).

The amplifier 320 comprises two inputs: an input 321, which receives a voltage VFB_CC from node 302 via connection 312, and an input 322, which receives a reference voltage VREF_CC from any suitable source of reference signals (e.g., other circuitry on the IC). The amplifier 316 comprises two inputs: an input 317, which receives a voltage VFB_CV from node 308 via connection 314, and an input 318, which receives a reference voltage VREF_CV from any suitable source of reference signals. The comparator 338 comprises two inputs: an input 341, which receives the voltage VFB_CC from node 302 via connection 312, and an input 342, which receives a reference voltage VREF_T-ERM from any suitable source of reference signals. The comparator 336 comprises two inputs: an input 339, which receives VFB_CC from node 302 via connection 312, and an input 340, which receives a reference voltage that is a fraction of VREF_CC (e.g., one-half of VREF_CC, or 0.5(VREF_CC)). The fraction may be set as desired, with practical considerations in selecting fraction values described in greater detail below.

Figure 4:
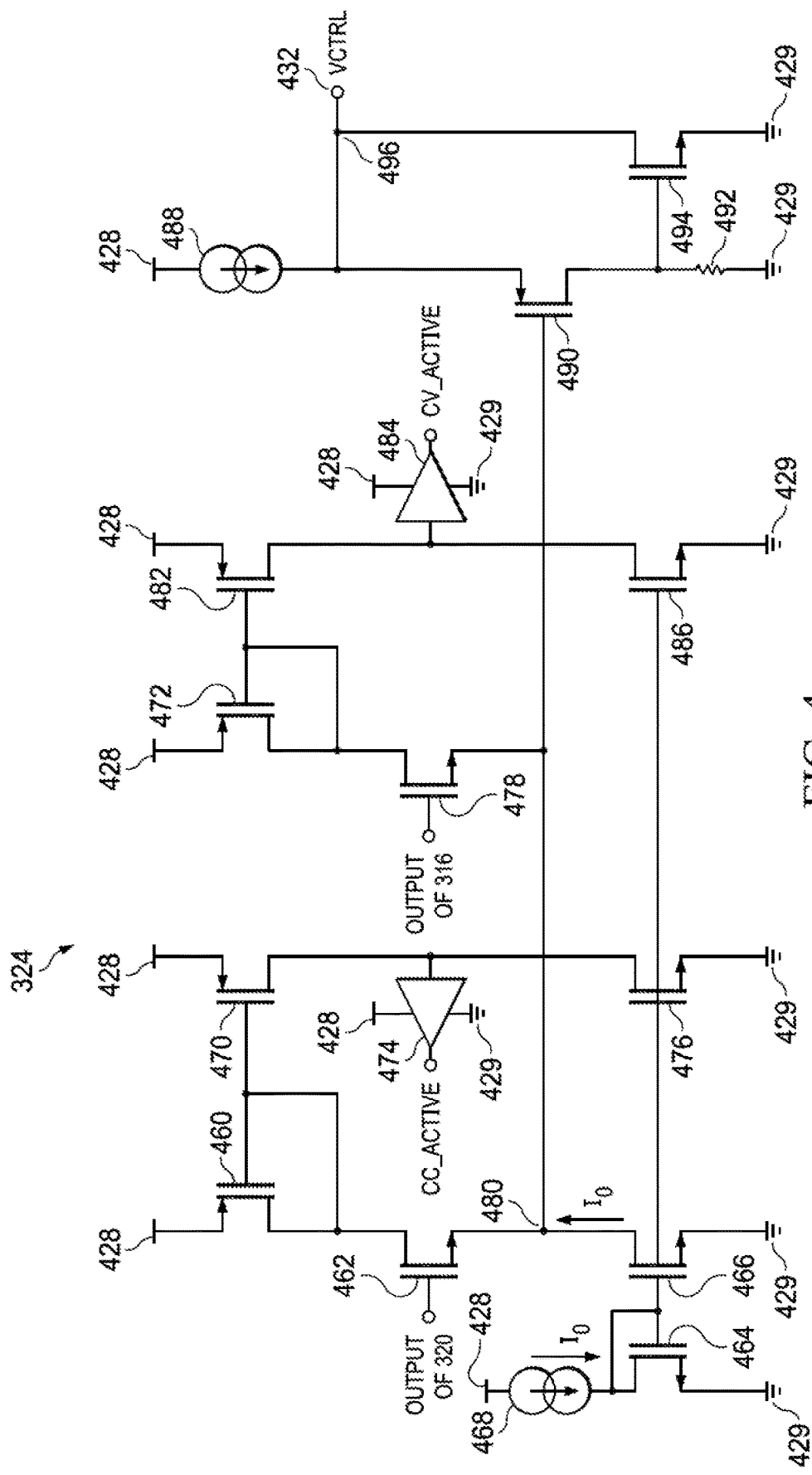
FIG. 4 shows a schematic diagram of an illustrative circuit in accordance with various examples.

The circuit 300 additionally includes an analog OR circuit 324 to implement a logic OR functionality. The analog OR circuit 324 receives the outputs of the amplifiers 316, 320 as inputs and provides signal VCTRL as an output on connection 332. An example analog OR circuit 324 is depicted in FIG. 4. The analog OR circuit 324 comprises p-type MOSFETs 460, 470, 472, and 482 having their sources coupled to voltage source 428. A drain of the p-type MOSFET 460 couples to the gate of the p-type MOSFET 460 and to a drain of n-type MOSFET 462. A gate of the n-type MOSFET 462 couples to the output of amplifier 320. The source of the n-type MOSFET 462 couples to node 480, which, in turn, couples to a drain of n-type MOSFET 466. The source of n-type MOSFET 466 couples to a ground terminal 429. A gate of the n-type MOSFET 466 couples to a gate of n-type MOSFET 464. The source of n-type MOSFET 464 couples to the ground terminal 429. The drain of n-type MOSFET 464 couples to a current source 468, which couples to voltage source 428. The drain of the n-type MOSFET 464 couples to the gates of n-type MOSFETs 464 and 466.

The gates of the p-type MOSFETs 460, 470 are coupled together. A drain of the p-type MOSFET 470 couples to the drain of n-type MOSFET 476. The source of n-type MOSFET 476 couples to the ground terminal 429 and a gate of the n-type MOSFET 476 couples to the gate of the n-type MOSFET 466. The drain of the n-type MOSFET 476 couples to a digital buffer 474, which produces an output CC_ACTIVE.

The node 480 couples to a source of n-type MOSFET 478, the gate of which couples to the output of amplifier 316. The drain of the n-type MOSFET 478 couples to the drain of p-type MOSFET 472. The gate of p-type MOSFET 472 couples to the gate of p-type MOSFET 482. The drain of p-type MOSFET 482 couples to the drain of n-type MOSFET 486, the gate of which couples to the gate of n-type MOSFET 476 and the source of which couples to the ground terminal 429. The drain of p-type MOSFET 482 couples to digital buffer 484, the output of which is CV_ACTIVE.

The node 480 couples to the gate of p-type MOSFET 490. A drain of p-type MOSFET 490 couples to resistor 492, which couples to the ground terminal 429. The drain of p-type MOSFET 490 also couples to the gate of n-type MOSFET 494, the source of which couples to the ground terminal 429. The source of p-type MOSFET 490 and the drain of n-type MOSFET 494 couple together at node 496, which couples to connection 432 and provides output signal VCTRL to connection 432. The node 496 couples to current source 488, which couples to the voltage source 428.

Referring again to FIG. 3, the circuit 300 comprises a controller 348, such as a processor. The controller 348 stores a multi-bit (e.g., m-bit) register 350. In an example, the register 350 is an 8-bit register, although any number of bits is usable. Practical considerations of selecting various register sizes are described in greater detail below. The controller 348 controls the contents of the register 350, for example by shifting bits to the left or to the right or by overwriting bits. The output of the comparator 336 couples to the controller 348 via a connection 344 that provides a SHIFT signal to the controller 348. The output of the comparator 338 couples to the controller 348 via a connection 346 that provides a termination (TERM) signal to the controller 348. Other configurations of, and various modifications to, the circuit 300 are contemplated and included within the scope of this disclosure. The controller 348 couples to the DAC 301 via connections 352. In at least some examples, the circuit 300 further includes a current source 354, a switch 356, and a resistor 358. The current source 354 is coupled between a power source 360 and a first terminal of the switch 356 and configured to source current toward the first terminal of the switch 356. A second terminal of the switch 356 is coupled to a terminal 362 (which, in some examples, is referred to as an $I_{max}$ terminal or an $I_{max}$ pin). The circuit 300 is configured to couple to a resistor 358 at the terminal 362. The resistor 358, in some examples, has a resistance of $R_{max}$, where $R_{max}$ is determined as discussed herein according to a desired $I_{max}$. In at least some examples, the controller 348 further includes an ADC 364 having an input at least coupled to the terminal 362, as well as having a register 366.

The operation of the circuit 300 is described by first referring only to the components other than the controller 348 and the comparators 336 and 338, and then explaining the function of the controller 348 and the comparators 336 and 338.

The DAC 301 outputs a current to the node 302 and outputs another current to the node 308. The current output to the node 308 is termed a charging current, since that current is provided to the battery 310 for charging. The current output to the node 302 is termed a proxy current, since the proxy current is a smaller fraction of the charging current. (The ratio between the proxy and charging currents is set using a network of appropriately-sized transistors housed within the DAC 301, as will be described further below.)

The charging current charges the battery 310. As the battery 310 charges, the voltage at node 308 rises. The voltage at node 308 is thus usable to monitor the charging status of the battery 310. However, it is not usable to monitor the amplitude of the charging current itself. The proxy current, which is a smaller fraction of the charging current, is helpful in this regard. By passing the proxy current through the resistor 304 and monitoring the voltage at node 302, the proxy current amplitude can be monitored. Thus, in effect, the voltage at node 302 serves as a proxy for the amplitude of the proxy current, and the amplitude of the proxy current serves as a proxy for the amplitude of the charging current. Accordingly, by monitoring the voltage at node 302, the amplitude of the charging current is likewise monitored.

The charging current, in at least some examples, is limited to $I_{max}$, as described elsewhere herein. To begin operation (e.g., such as when the circuit 300, or a device including the circuit 300 is first turned-on or powered-up), the controller 348 controls the switch 356 to close such that the current source 354 sources a constant current of magnitude 10 through the terminal 362 and resistor 358. While the constant current is sourced through the resistor 358, the ADC 364 detects a voltage present at the terminal 362 and converts a value of that voltage from an analog domain value to a digital domain value, providing the digital domain value to the register 366 or another storage device (not shown) for storage. The voltage detected and converted by the ADC 364, in at least some examples, has a value of approximately $R_{max}*I0$.

In at least some examples, the digital domain value output by the ADC 364 and stored in the register 366 operates as a limit to the charging current (e.g., establishing $I_{max}$) that may be provided by the circuit 300 to the battery 310. To modify $I_{max}$, $R_{max}$ the resistor 358 is modified. For example, by increasing $R_{max}$, the voltage detected and converted by the ADC 364 in the presence of the constant current increases, increasing $I_{max}$. When $R_{max}$ decreases, the voltage detected and converted by the ADC 364 in the presence of the constant current decreases, decreasing $I_{max}$. In some examples, the ADC 364 performs only one measurement (e.g., detection and conversion). In other examples, the ADC 364 performs a plurality of measurements. For example, if a first measurement of the ADC 364 fails (e.g., such that a value stored in the register 366 is invalid, falls outside of acceptable bounds, etc.) the ADC 364 performs a second measurement. In some examples, if the second measurement of the ADC 364 fails the circuit 300 prevents charging of the battery 310, proceeding under an assumption of hardware damage to a component of the circuit 300, the battery 310, or some device or component coupled directly or indirectly to the circuit 300 or battery 310. In other examples, the ADC 364 repeats the measurement process any predetermined number of times before preventing charging of the battery 310 (e.g., performing three measurements, four measurements, five measurements, etc.). Use of the ADC 364 and the register 366 in place of an alternative control arrangement, in at least some examples, is advantageous over the alternative control arrangement (e.g., such as an analog control loop) in multiple ways. For example, in at least some implementations, the ADC 364 is implemented in the controller 348 regardless of the presence of the functionality of $I_{max}$ limiting described herein, thus utilizing the ADC 348 reuses already present resources and thereby limits additional die space utilized in implementing the $I_{max}$ limiting described herein. Further, operation in a digital domain is often more stable than in an analog domain, greater flexibility is afforded to possible manipulation, monitoring, and use of digital values, more rapid and simplified detection of failure of the resistor 358, and because $I_{max}$ is determined at startup (or other defined, discrete times), the $I_{max}$ limiting described herein consumes less power than an analog loop alternative because it does not remain always turned on as an analog loop would.

Description of the circuit 300 now proceeds under the condition in which the ADC 364 performs a successful measurement and provides a valid digital domain value representing $I_{max}$ to the register 366 for storage, after the measurement is made the circuit 300 proceeds to provide power to the battery 310 for charging, as will now be discussed. In at least some examples, after a valid measurement for $I_{max}$ is stored in the register 366, the controller 348 controls the switch 356 to open such that the constant current is no longer sourced through the resistor 358. In various examples, the controller 348 repeats the above measurement process any one or more additional times throughout operation of the circuit 300 after having already stored a valid $I_{max}$ value in the register 366, for example, to determine if $R_{max}$ has been modified during operation of the circuit 300 to correspondingly change $I_{max}$.

The amplifier 316 produces an output based on the difference between the voltage at node 308 and VREF_CV. The amplifier 320 produces an output based on the difference between the voltage at node 302 and VREF_CC. Referring to FIG. 4, the output of amplifier 316 couples to the gate of n-type MOSFET 478, and the output of amplifier 320 couples to the gate of n-type MOSFET 462. The n-type MOSFETs 462, 466 form an NMOS source follower. The n-type MOSFETs 478, 466 form another NMOS source follower. The MOSFETs 490, 494 form a super source follower. The analog OR function is primarily implemented by the n-type MOSFETs 462, 478. The output of amplifier 320 turns on the n-type MOSFET 462 fully or weakly, depending on the signal applied to the gate terminal of the n-type MOSFET 462. Similarly, the output of amplifier 316 turns on the n-type MOSFET 478 fully or weakly, depending on the signal applied to the gate terminal of the n-type MOSFET 478. The source of n-type MOSFET 462 follows the gate of n-type MOSFET 462, and the same is true for the source and gate of n-type MOSFET 478. Whichever of the two MOSFETs 462, 478 is more strongly turned on will pass most (e.g., 90% or more) of the current 10 generated by the current source 468 and mirrored by the MOSFETs 464, 466 to node 480. The sources of the MOSFETs 462, 478 couple at node 480, meaning that whichever of the two MOSFETs is most strongly turned on and has a current contribution to node 480 that dominates the node 480 will be the main driver of the gate of p-type MOSFET 490. The source of the p-type MOSFET 490 follows the gate of the p-type MOSFET 490. Thus, the gate signal drives VCTRL on node 496 at connection 432. (As explained in detail below, VCTRL controls the proxy and charging currents by controlling the drain-source channels of the transistors in the DAC 301.)

The n-type MOSFET 494 acts as a super source follower that lowers the impedance on node 496 and adds stability to VCTRL. The n-type MOSFET 494 pulls down the node 496 (VCTRL) as a result of current flowing through the resistor 492 (and thus turning on the n-type MOSFET 494) when p-type MOSFET 490 is turned on. The p-type MOSFET 490, in turn, is turned on when node 480 goes low.

The MOSFETs 460, 470, and 476 and the digital buffer 474 form a current comparator that detects when the amplifier 320 dominates VCTRL, and the MOSFETs 472, 482, and 486 and the digital buffer 484 form another current comparator that detects when the amplifier 416 dominates VCTRL. The digital buffer 474 produces an output CC_ACTIVE that indicates whether or not the amplifier 320 dominates VCTRL, and the digital buffer 484 produces an output CV_ACTIVE that indicates whether or not the amplifier 316 dominates VCTRL. When CC_ACTIVE is high, CV_ACTIVE is low, and vice versa. Specifically, in the case where the amplifier 320 strongly turns on the n-type MOSFET 462, the majority (e.g., 90%) of the current 10 flows through MOSFETs 462, 460, and 470, while a substantially smaller current flows through the n-type MOSFET 476. The greater current through p-type MOSFET 470 relative to the current through n-type MOSFET 476 pulls up the input to the digital buffer 474, causing CC_ACTIVE to be high. Conversely, when the amplifier 320 is not strongly turned on, the current flowing through MOSFETs 462, 460, and 470 is significantly lower (e.g., 10% of the 10 current). In this situation, the current through n-type MOSFET 476 is greater than current through p-type MOSFET 470, thus pulling the input to the digital buffer 474 down and causing CC_ACTIVE to be low. A similar principle applies to the operation of the current comparator formed by MOSFETs 472, 482, 486, and the digital buffer 484.

Returning to FIG. 3, the CC_ACTIVE and/or CV_ACTIVE signals are provided to and usable by the controller 348. In the relatively early stages of charging the battery 310, the voltage at node 308 is far below VREF_CV. As a result, the output of the amplifier 316 is small, and the amplifier 316 thus does not control VCTRL. The amplifier 320, however, does control VCTRL, because the amplifier 320 operates in a feedback loop whereby the amplifier 320 adjusts its output (VCTRL) in an attempt to equalize its two inputs. Thus, the voltage at node 302 is substantially equivalent to VREF_CC. (The amplifier 316 also attempts to equalize its inputs, but to do so, the battery 310 is to be charged to a point that the voltage at node 308 is equivalent to VREF_CV, which is a time-consuming process. The voltage at node 302 adapts more quickly because it connects to a resistor 304 instead of a battery.)

For the reasons just described, in the early stages of the charging process, the voltage at node 302 is roughly equivalent to the value selected for VREF_CC, and thus the proxy current is set by the value selected for VREF_CC. The charging current is a function of the proxy current according to a ratio set by the network of transistors within the DAC 301 (described below). In an example, the charging current is 3× the proxy current. In an example, the charging current is 4× the proxy current. Other ratios are contemplated and included in the scope of this disclosure.

In these early stages of the charging process, therefore, the battery 310 continues to charge at a rate that is determined by the charging current amplitude, which, in turn, is determined by the proxy current, which, in turn, is determined by the voltage at node 302, which, in turn, is determined by the value selected for VREF_CC. However, there comes a point in time when the battery 310 is sufficiently charged that the voltage at node 308 is close enough to VREF_CV that the output of the amplifier 316 dominates the output of the amplifier 320 and takes control of VCTRL, as described above with respect to FIG. 4. The VCTRL signal continues to decrease as the battery 310 approaches a fully charged status, which causes the charging current to decrease as well. As the amplifier 320 no longer controls the proxy current, the proxy current is now a function of the charging current. As explained above, in examples, the proxy current is a smaller fraction of the charging current according to a ratio set by the transistor network within the DAC 301 (described in detail below).

As the charging current continues to decrease due to the battery 310 continuing to charge, the proxy current likewise decreases. Although the amplifier 320 has minimal or no effect on VCTRL, the voltage at node 302 is still used by the comparator 338 to determine when the charging process should be terminated. If the voltage at the node 302 is so small that it is difficult to accurately interpret (e.g., due to being masked by noise), the comparison performed by the comparator 338 between the voltage at node 302 and VREF_TERM can be flawed. In such instances, the TERM signal can be asserted (or, in some examples, de-asserted) at inappropriate times.

Accordingly, it is beneficial to repeatedly increase the voltage at node 302 when the voltage at node 302 drops below a threshold, thereby providing an easy-to-read voltage at node 302. This is at least part of the function of the comparator 336, the controller 348, the register 350, and the DAC 301, as is now described with respect to FIG. 5.

Figure 5:
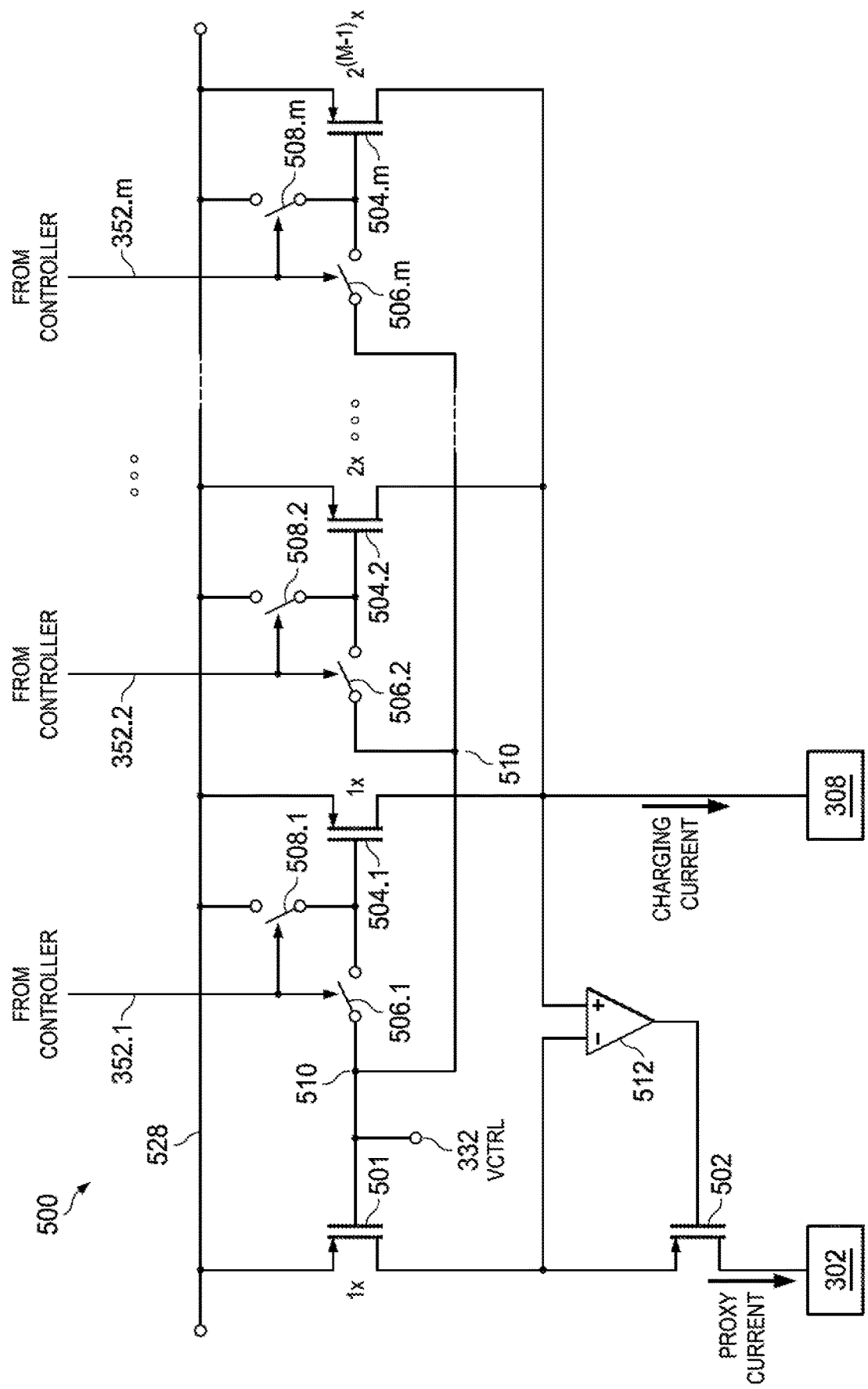
FIG. 5 shows a schematic diagram of an illustrative circuit in accordance with various examples.

FIG. 5 depicts a circuit schematic diagram of an example circuit 500 suitable, in some examples, for implementation as the DAC 301. As mentioned above, the DAC 301 includes a network of transistors, which are now described and which, in at least some examples, are metal oxide semiconductor field effect transistors (MOSFETs), such as p-type MOSFETs. The network of transistors in the DAC 301 includes a transistor 501 having a source terminal coupled to a voltage supply 528 and a drain terminal coupled to the source terminal of a transistor 502. The drain terminal of the transistor 502 couples to the node 302. (The node 302 is not part of the DAC 301.) The drain terminal of the transistor 501 and the source terminal of the transistor 502 couple to an inverting input of an amplifier 512 (e.g., differential amplifier). The output of the amplifier 512 couples to a gate terminal of the transistor 502 and adjusts the drain-source channel of the transistor 502 in an attempt to equalize the voltages at the drains of the transistors 501 and the transistors 504.1, 504.3, . . . , 504.m. The gate terminal of the transistor 501 couples to the connection 332 (VCTRL) at a node 510.

The network of transistors in the DAC 301 further comprises a set of transistors that couple to the node 308. (The node 308 is not part of the DAC 301.) In an example, the set of transistors includes transistors 504.1, 504.3, . . . , 504.m, where m corresponds to the number of bits in the register 350. In an example, the transistors 504.1, 504.3, . . . , 504.m are sized in an ascending manner relative to the transistor 501. For example, assuming transistor 501 has a size of 1×, the transistor 504.1 has a size of 1×, the transistor 504.3 has a size of 3×, and the transistor 504.m has a size of $3^{(m-1)}$×. Thus, in this example, the transistor 504.m is substantially larger in size than the transistor 504.1, and the transistor 504.1 is the same size as the transistor 501. Other sizing configurations are contemplated.

The source terminals of the transistors 504.1, 504.3, . . . , 504.m couple to the voltage supply 528. The drain terminals of these transistors couple to each other, to the non-inverting input to the amplifier 512, and to the node 308. Each of the gate terminals of these transistors 504.1, 504.3, . . . , 504.m is switchably coupled to the voltage supply 528 and is switchably coupled to the gate terminal of the transistor 501 at node 510. For example, the gate terminal of the transistor 504.1 is switchably coupled to the voltage supply 528 via switch 508.1 and is switchably coupled to the node 510 via switch 506.1. In an example, the switches 508.1 and 506.1 are MOSFETs. In an example, the switches 508.1 and 506.1 are p-type and complementary (CMOS) MOSFETs, respectively, and are controlled by a signal on a connection 352.1 from the controller 348.

The gate terminal of the transistor 504.3 is switchably coupled to the voltage supply 528 via a switch 508.3 (e.g., a p-type MOSFET) and to the node 510 via a switch 506.3 (e.g., a CMOS). The switches 508.3 and 506.3 are controlled by a signal on a connection 352.3 from the controller 348. The gate terminal of the transistor 504.m is switchably coupled to the voltage supply 528 via a switch 508.m (e.g., a p-type MOSFET) and to the node 510 via a switch 506.m (e.g., a CMOS). The switches 508.m and 506.m are controlled by a signal on a connection 352.m from the controller 348.

The signals on connections 352.1, 352.3, . . . , 352.m from the controller 348 are based on bits in the register 350 and/or the register 366. In an example, the signal on connection 352.1 depends on the value of the least significant bit in the register 350 and/or the register 366, the signal on connection 352.3 depends on the value of the second-least significant bit in the register 350 and/or the register 366, and the signal on connection 352.m depends on the most significant bit in the register 350 and/or the register 366. In at least some examples, the controller 348 performs one or more operations on the values stored in the register 350 and the register 366 to determine which of the value stored in the register 350 or the value stored in the register 366 is greater. When the value stored in the register 366 is greater, the signals on connections 352.1, 352.3, . . . , 352.m from the controller 348 are based on bits in the register 350. When the value stored in the register 350 is greater, the programmed charging current stored in the register 350 exceeds $I_{max}$ as stored in the register 366 and the signals on connections 352.1, 352.3, . . . , 352.m from the controller 348 are based on bits in the register 366. In this way, the charging current is limited to $I_{max}$, which is determined according to $R_{max}$, advantageously protecting the circuit 300, battery 310, and other devices (not shown) coupled to the circuit 300 and/or battery 310 from damage resulting from a programmed charging current stored in the register 350 exceeding a safe charging current for the battery 310, either as a result of mistake or of malicious activity.

The operation of the DAC 301 is now described in tandem with FIGS. 3, 4, and 5. As explained above, it is possible that the voltage at node 302 becomes so low (particularly when charging is almost complete) that it is difficult to accurately interpret the voltage and thus properly terminate charging of the battery 310. In such instances, as also explained above, it is beneficial to repeatedly boost the amplitude of the voltage at node 302 in response to that voltage dropping below a threshold. Boosting the voltage in this manner facilitates accurate and precise interpretation of the voltage at node 302. The manner in which this voltage is increased is now described.

When the voltage at node 302 drops below the reference voltage (e.g., 0.5*VREF_CC) at input 340, the SHIFT signal is asserted. In response to assertion (or, in examples, de-assertion) of SHIFT, the controller 348 shifts the bits in the register 350 to the right by one bit. Thus, for example, the bit that was previously in the least significant bit location is no longer in the register 350, while the bit that was previously in the most significant bit location is now in the second-to-most significant bit location, and the most significant bit location is populated with a 0 bit. (Each shift to the right in this manner is equivalent to dividing the digital bit value by two.) In this manner, the transistor 504.m, which has a size $3^{(m-1)}$× relative to the size 1× of the transistor 501, is turned off, since the most significant bit of the register 350 is now populated with a 0. Each time the bits in the register 350 are adjusted due to the voltage at node 302 dropping below the threshold at input 340, more transistors 504.1, 504.3, . . . , 504.m turn off. Each time one or more transistors 504.1, 504.3, . . . , 504.m turns off, the ratio of the charging current to the proxy current decreases, since there are fewer transistors 504.1, 504.3, . . . , 504.m contributing current to the charging current provided to node 308. This process is iteratively repeated until only the transistor 504.1 remains on, while the rest of the transistors 504.3, ..., 504.*m* are off. In an example, transistor 504.1 has a 1:1 sizing ratio relative to the transistor 501, and so the proxy and charging currents are the same. At this point in time, the charging current and proxy current are both very small, the battery 310 is nearly fully charged, and the charging process is suitable for termination.

Figure 6:
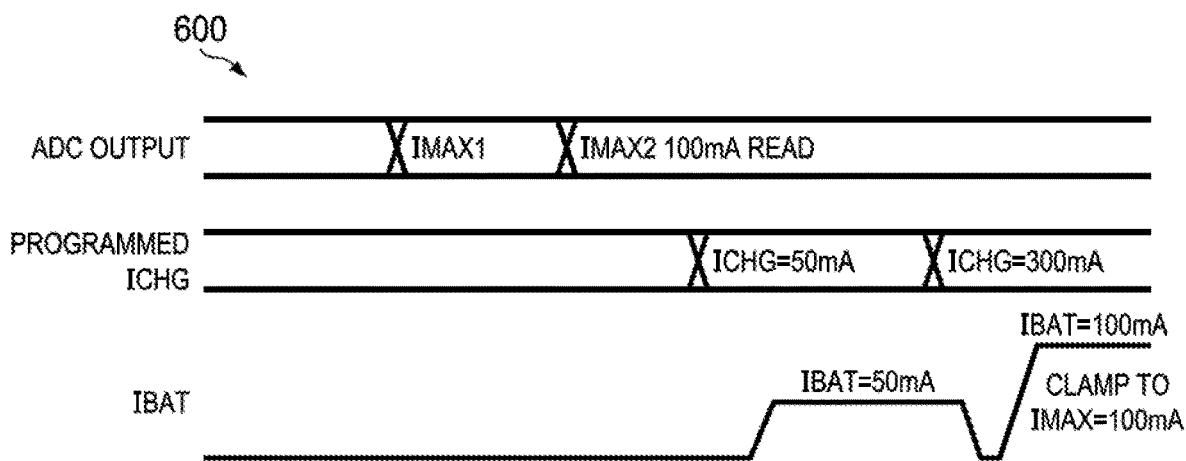
FIG. 6 shows a diagram of illustrative waveforms in accordance with various examples.

Turning now to FIG. 6, a diagram 600 of illustrative signals is shown. The diagram 600 illustrates an ADC output (IMAX), such as an output of the ADC 364 of the circuit 300 of FIG. 3 that is stored in the register 366, a programmed charging current (ICHG), such as is stored in the register 350, and a battery charge current (IBAT), such as an actual current being used to charge the battery 310. As shown in FIG. 6, when ICHG is less than IMAX, IBAT is approximately equal to ICHG. However, when ICHG exceeds IMAX, IBAT is clamped to IMAX. ICHG exceeds IMAX, in various examples, in response to a mistaken programming of a value of ICHG to a register, incorrectly programmed software, a hardware malfunction, malicious alteration of the ICHG value stored in the register, etc. While 50 milliamps (mA), 100 mA, and 300 mA are used in the diagram 600 for ease of understanding, in practice and actual implementation each of the illustrated signals may have any value consistent with the description set forth herein.

Figure 7:
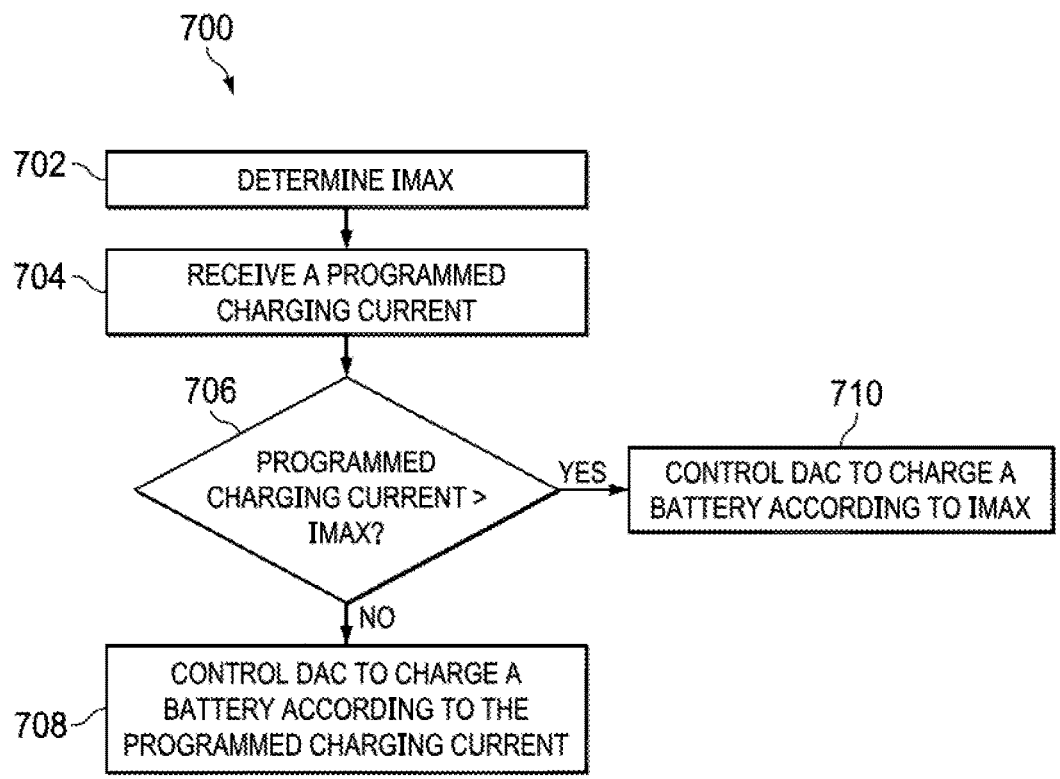
FIG. 7 shows a flowchart of an illustrative method in accordance with various examples.

Turning now to FIG. 7, a flowchart of an illustrative method 700 is shown. In at least some examples, the method 700 is representative of operation of, or suitable for implementation by, the battery charging circuit 104, circuit 200, and/or circuit 300, individually or in combination. The method 700 is, in at least some examples, a method for charging a rechargeable battery.

At operation 702, $I_{max}$ is determined. $I_{max}$ is determined, in at least some examples, by sourcing a constant current through a $R_{max}$ resistor (e.g., a resistor having a resistance of $R_{max}$) and measuring a resulting voltage that approximately equals a value of the constant current times $R_{max}$. The measurement is performed, in some examples, in an analog domain by an ADC and a result of the measurement is provided by the ADC as a digital output in a digital domain. In at least some examples, the ADC further provides the digital output to a register for storage and/or subsequent use.

At operation 704, a programmed charging current is received. The programmed charging current is received, in at least some examples, from a user, while in other examples the programmed charging current is determined by a computing device or component and provided by the computing device for use in the method 700. The programmed charging current is stored, in some examples, in a shift register or other storage component. In some examples, the programmed charging current is less than or equal to $I_{max}$. In other examples, the programmed charging current is greater than $I_{max}$. For example, in some circumstances the programmed charging current may have been modified without authorization (e.g., such as by a malicious or third-party actor) or the user may have mistakenly provided a programmed charging current that exceeds safe limits for charging. In some examples, after receipt from the users (such as in a digital domain format) and storage in the shift register, the digital domain value stored in the shift register is converted to an analog domain value by a DAC such as a binary weighted DAC. Additionally, in at least some examples, ICHG is a programmable value that is modifiable during operation of the method 700. In such examples, each time ICHG is modified, the method 700 repeats operation either beginning at the operation 702 or beginning at the operation 704.

At operation 706, the programmed charging current is compared to $I_{max}$ to determine whether the programmed charging current exceeds $I_{max}$. The comparison is performed, in at least some examples, by a digital logic structure suitable for comparing the contents of registers or other storage components. In some examples, the comparison is performed by a controller, such as a processor or other device capable of performing processing such as logical operations, mathematical operations, etc. When the programmed charging current does not exceed $I_{max}$, the method proceeds to operation 708. When the programmed charging current exceeds $I_{max}$, the method proceeds to operation 710.

At operation 708, the controller controls a DAC to charge a battery with a charging current specified by the programmed charging current. The controller controls the DAC, in some examples, by controlling one or more switchable devices according to individual bits of the programmed charging current to cause current to flow through the switchable devices or not flow through the switchable devices until the charging current used to charge the battery is approximately equal to the programmed charging current.

At operation 710, the controller controls the DAC to charge a battery with a charging current specified by $I_{max}$ (e.g., clamps the charging current to $I_{max}$ despite the programmed charging current that exceeds $I_{max}$). The controller controls the DAC, in some examples, by controlling one or more switchable devices according to individual bits of the programmed charging current to cause current to flow through the switchable devices or not flow through the switchable devices until the charging current used to charge the battery is approximately equal to $I_{max}$.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, MOSFET, n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
a controller, comprising:
an analog-to-digital converter (ADC) having an input and an output;
a first register; and
a second register coupled to the output of the ADC;
a current source having an output;
a switch coupled between the output of the current source and a first node and having a control terminal coupled to the controller, wherein the first node is coupled to the input of the ADC and is configured to couple to a resistor; and
a digital-to-analog converter (DAC) having an input coupled to the controller and an output configured to couple to a battery.

2. The circuit of claim 1, wherein the controller is configured to control the switch to close to source current through the resistor to cause the ADC to generate a digital representation of a value of a signal present at the first node and store the digital representation in the second register.

3. The circuit of claim 2, wherein the first register is configured to receive a programmed charging current for charging the battery via the DAC.

4. The circuit of claim 3, wherein the controller is configured to compare the programmed charging current stored in the first register to the digital representation stored in the second register and control the DAC to charge the battery at a charging rate defined by a lesser of the programmed charging current stored in the first register or the digital representation stored in the second register.

5. The circuit of claim 1, wherein the first register is configured to store a first number of bits, wherein the second register is configured to store the first number of bits, and wherein each bit stored by the first register and the second register corresponds to a device of the DAC.

6. The circuit of claim 5, wherein each bit stored by the first register and the second register corresponds to a transistor of the DAC such that a value of a bit stored by the first register or the second register controls operation of a respective transistor of the DAC.

7. The circuit of claim 6, wherein a charging current provided to the battery is determined according to a value stored in the first register or the second register and a conductive state of the transistors of the DAC corresponding to each bit stored by the first register or the second register based on the value stored in the first register or the second register.

8. The circuit of claim 1, wherein the DAC is a binary-weighted DAC.

9. A circuit, comprising:
a controller configured to control charging of a battery, the controller comprising:
an analog-to-digital converter (ADC) having an input and an output;
a first register configured to receive a programmed charging current value; and
a second register coupled to the output of the ADC;
a current source configured to source a constant current;
a switch controlled by the controller and coupled between the current source and a first node coupled to the ADC and configured to couple to a resistor to determine a maximum charging current for the battery; and
a digital-to-analog converter (DAC) coupled to the controller and the battery and configured to provide a charging current to the battery based on control exerted on the DAC by the controller.

10. The circuit of claim 9, wherein the maximum charging current for the battery is determined according to a voltage present at the first node, measured and converted to a digital representation by the ADC, and stored in the second register.

11. The circuit of claim 9, wherein the controller is configured to compare the programmed charging current value to the maximum charging current and control the DAC to charge the battery with a charging current having a value equal to a lesser of the programmed charging current value or the maximum charging current.

12. The circuit of claim 9, wherein the controller is configured to control the switch to close to source the constant current through the resistor to cause the ADC to generate a digital representation of a value of a signal present at the first node and store the digital representation in the second register as the maximum charging current.

13. The circuit of claim 9, wherein the DAC is a binary-weighted DAC having a plurality of transistors.

14. The circuit of claim 13, wherein the first register and the second register are each configured to store a plurality of bits, wherein control of each of the plurality of transistors of the DAC uniquely corresponds to one of the plurality of bits of the first register and one of the plurality of bits of the second register, and wherein the charging current is determined according to which of the plurality of transistors are in a conductive state based on a lesser of the programmed charging current value or the maximum charging current.

15. A system, comprising:
a battery; and
a battery charging circuit coupled to the battery, the battery charging circuit comprising:
a controller, comprising:
an analog-to-digital converter (ADC) having an input and an output;

a first register configured to receive a programmed charging current for charging the battery via a digital-to-analog converter (DAC); and a second register coupled to the output of the ADC;

a current source having an output;

a switch coupled between the output of the current source and a first node and having a control terminal coupled to the controller, wherein the first node is coupled to the input of the ADC to enable the ADC to determine a maximum charging current for charging the battery;

a resistor coupled to the first node; and the DAC, having an input coupled to the controller and an output coupled to the battery.

16. The system of claim 15, wherein the controller is configured to control the switch to close to source current through the resistor to cause the ADC to generate a digital representation of a value of a signal present at the first node and store the digital representation in the second register.

17. The system of claim 15, wherein the controller is configured to compare the programmed charging current stored in the first register to the digital representation stored in the second register and control the DAC to charge the battery at a charging rate defined by a lesser of the programmed charging current stored in the first register or the digital representation stored in the second register.

18. The system of claim 15, wherein the first register and the second register are each configured to store a plurality of bits, wherein the DAC is a binary-weighted DAC having a plurality of transistors, and wherein control of each of the plurality of transistors of the DAC uniquely corresponds to one of the plurality of bits of the first register and one of the plurality of bits of the second register.

19. The system of claim 18, wherein a charging current with which the battery is charged is determined according to which of the plurality of transistors are in a conductive state based on a lesser of the programmed charging current value or the maximum charging current.

20. The system of claim 15, wherein the programmed charging current is reprogrammable during operation of the system, wherein the maximum charging current is redeterminable during operation of the system, and wherein a maximum value of the charging current is clamped to the maximum charging current.

* * * * *